United States Patent
Sano

[11] Patent Number: 5,903,853
[45] Date of Patent: May 11, 1999

[54] RADIO TRANSCEIVER INCLUDING NOISE SUPPRESSOR

[75] Inventor: Hideo Sano, Tokyo, Japan

[73] Assignee: NEC Corporation, Tokyo, Japan

[21] Appl. No.: 08/806,413

[22] Filed: Feb. 26, 1997

Related U.S. Application Data

[63] Continuation of application No. 08/208,840, Mar. 11, 1994, abandoned.

[30] Foreign Application Priority Data

Mar. 11, 1993 [JP] Japan .................................. 5-050322

[51] Int. Cl.$^6$ ...................................................... H04Q 7/32
[52] U.S. Cl. .......................................... 455/570; 455/550
[58] Field of Search .............................. 381/56; 455/570, 455/550, 569, 501, 63, 67.1, 67.3, 79, 81, 70, 84

[56] References Cited

U.S. PATENT DOCUMENTS

| | | | |
|---|---|---|---|
| 1,668,757 | 5/1928 | Bown et al. | 455/63 |
| 2,546,987 | 4/1951 | Eannarino | 455/63 |
| 2,632,101 | 3/1953 | Quarles | 455/63 |
| 2,849,537 | 8/1958 | Eglin | 455/63 |
| 3,084,329 | 4/1963 | Clay | 455/63 |
| 3,117,278 | 1/1964 | Johnson | 455/63 |
| 3,231,819 | 1/1966 | Aaron | 455/63 |
| 3,341,659 | 9/1967 | Stern | 455/63 |
| 3,535,689 | 10/1970 | Oden | 379/58 |
| 4,334,317 | 6/1982 | Beesley | 455/219 |
| 4,461,025 | 7/1984 | Franklin | 381/56 |
| 4,466,129 | 8/1984 | Skutta | 455/219 |
| 4,480,335 | 10/1984 | Kishi | 455/219 |
| 4,683,386 | 7/1987 | Kamikawara | 455/219 |
| 4,737,976 | 4/1988 | Borth et al. | 379/63 |
| 4,811,421 | 3/1989 | Havel et al. | 379/58 |
| 4,860,359 | 8/1989 | Eicher | 455/79 X |
| 4,908,855 | 3/1990 | Ohga et al. | 379/390 |
| 5,014,294 | 5/1991 | Kromenaker et al. | 379/58 |
| 5,239,683 | 8/1993 | Usui | 455/63 |
| 5,329,243 | 7/1994 | Tay | 455/501 |
| 5,416,829 | 5/1995 | Umemoto | 455/570 |

FOREIGN PATENT DOCUMENTS

| | | |
|---|---|---|
| 0288078 | 10/1988 | European Pat. Off. . |
| 0452734 | 10/1991 | European Pat. Off. . |
| 0544101 | 6/1993 | European Pat. Off. . |
| 2197166 | 5/1988 | United Kingdom . |

OTHER PUBLICATIONS

Patent Abstracts of Japan, vol. 14, No. 496 (E–996).
Patent Abstracts of Japan, vol. 13, No. 198 (E–756).
C.B. Southcott et al., "Voice Control of the Pan–European Digital Mobile Radio System", IEEE Global Telecommunications conference, Nov. 27–30, 1989, pp. 1070–1074.

*Primary Examiner*—Dwayne D. Bost
*Assistant Examiner*—William G. Trost
*Attorney, Agent, or Firm*—Sughrue, Mion, Zinn, Macpeak & Seas, PLLC

[57] ABSTRACT

A noise suppressing circuit in a digital portable telephone which adjusts a level of signals from a microphone through an analog-to-digital converter to suppress ambient noise. An encoder producers encoded signals from output signals of the noise suppressing circuit. By suppressing ambient noise in a transmitting side, the digital portable telephone is capable of preventing an awkward feeling to a person in a receiving side.

17 Claims, 5 Drawing Sheets

RADIO TRANSCEIVER INCLUDING NOISE SUPPRESSOR

This is a Continuation of U.S. application Ser. No. 08/208,840 filed Mar. 11, 1994; now abandoned.

BACKGROUND OF THE INVENTION

1. Field of the Invention

The present invention relates to a radio transceiver and, more particularly, to a portable telephone of a digital mobile communication system.

2. Description of the Related Art

A portable telephone!, which permits communication at any time anywhere, is often used in a place where the ambient noise is great, such as in a car or train or on a railway platform. However, the speech encoding system used in digital portable telephones, because it is an encoding system optimizing speech signals, involves the problem that ambient noise included in decoded signals at a receiving side is different from that in wired telephone. Accordingly, a person using the portable telephone hears poor quality sound signals which are uncomfortable to the listener's audio perceptions.

SUMMARY OF THE INVENTION

It is therefore an object of the present invention to provide a digital portable telephone capable of reducing the ambient noise component of the telephone signal.

It is another object of the present invention to provide a digital portable telephone capable of reducing the listener's awkward feeling which derives from the difference between the ambient noise generated by the decoder and that of the original sound by making it possible to keep the ambient noise level low.

According to the present invention, the inventive radio transceiver comprises noise suppressing circuitry for adjusting a level of speech signals through a microphone for suppressing ambient noise and for supplying noise suppressed signals to an encoder for encoding the noise suppressed signals and providing encoded signals.

BRIEF DESCRIPTION OF THE DRAWINGS

The above and other objects, features and advantages of this invention will become more apparent from the following detailed description taken with the accompanying drawings in which.

In the drawings, the same reference numerals denote the same structural elements.

DESCRIPTION OF THE PREFERRED EXBODIMENT

First, to facilitate an understanding of the present invention, a conventional digital portable telephone will be described with reference to FIGS. 1 and 2.

Figure 1:
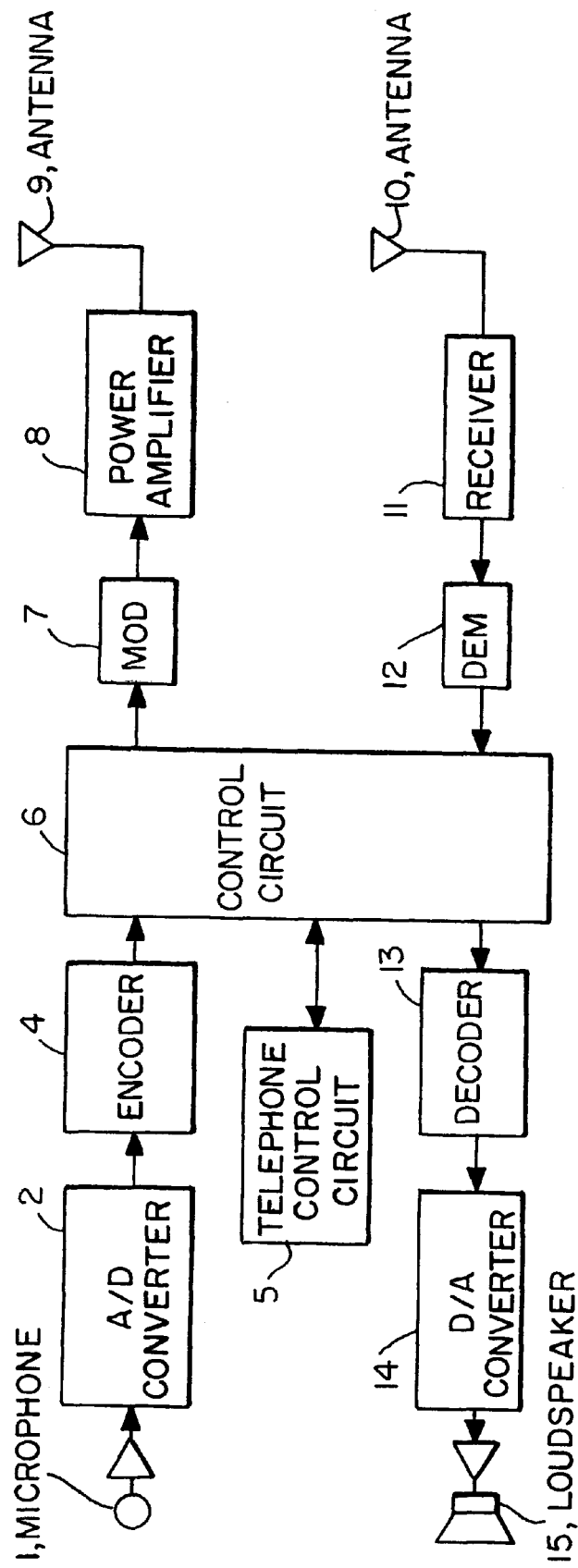
FIG. 1 is a block diagram schematically showing a conventional digital portable telephone.

In FIG. 1, the digital portable telephone comprises a microphone 1, an analog-to-digital (A/D) converter 2, an encoder 4, a control circuit 6, a telephone control circuit 5, a modulator 7, a power amplifier 8, antennas 9 and 10, a receiver 11, a demodulator 12, a decoder 13, a digital-to-analog converter 14 and a loudspeaker 15.

Analog speech signals from the microphone 1 are converted to digital signals with the A/D converter 2 and encoded to encoded signals with the encoder 4. The control circuit 6 mixes the encoded signals and control information from the telephone control circuit 5 and outputs the mixed signal to the modulator 7. The modulator 7 produces quadrature phase shift keying (QPSK) modulated signals. The QPSK modulated signals are amplified with the power amplifier 8 and transmitted from the antenna 9 to a base station (not shown).

Also, the receiver 11 receives a radio signal from the base station through the antenna 10 and outputs received signals. The demodulator 12 demodulates received signals. The demodulated signals are input to the control circuit 6 which separates the control signal from the encoded signals. The encoded signals from the control circuit 6 are input to the decoder 13. The decoder 13 decodes the encoded signals into speech signals. The speech signals are converted by the D/A converter 14 into analog signals and outputted to the loudspeaker 15.

In the above-described digital mobile communication system, the Code Excited LPC (CELP) formula is used as the full-rate speech encoding in the encoder 4 shown in FIG. 1. The CELP formula is a formula to vector-quantize voice source signals obtained by linear prediction and pitch prediction, using a code book consisting of a set of waveform patterns as is known in the art. Basic blocks of the encoder 4 shown in FIG. 1 are illustrated in FIG. 2. The encoder consists of an Linear Predictive Coefficient (LPC) analyzer 30, a short-term predictor 31, a long-term predictor 32, a excitation code book 33, an amplifier 36, an perceptual weighing filter 38, a minimization control circuit 39, and a subtractor 40. The long-term predictor consists of an adaptation code book 34, an amplifier 35 and an adder 37. The short-term predictor 31 consists of an adder and a short-term predictive filter.

Figure 2:
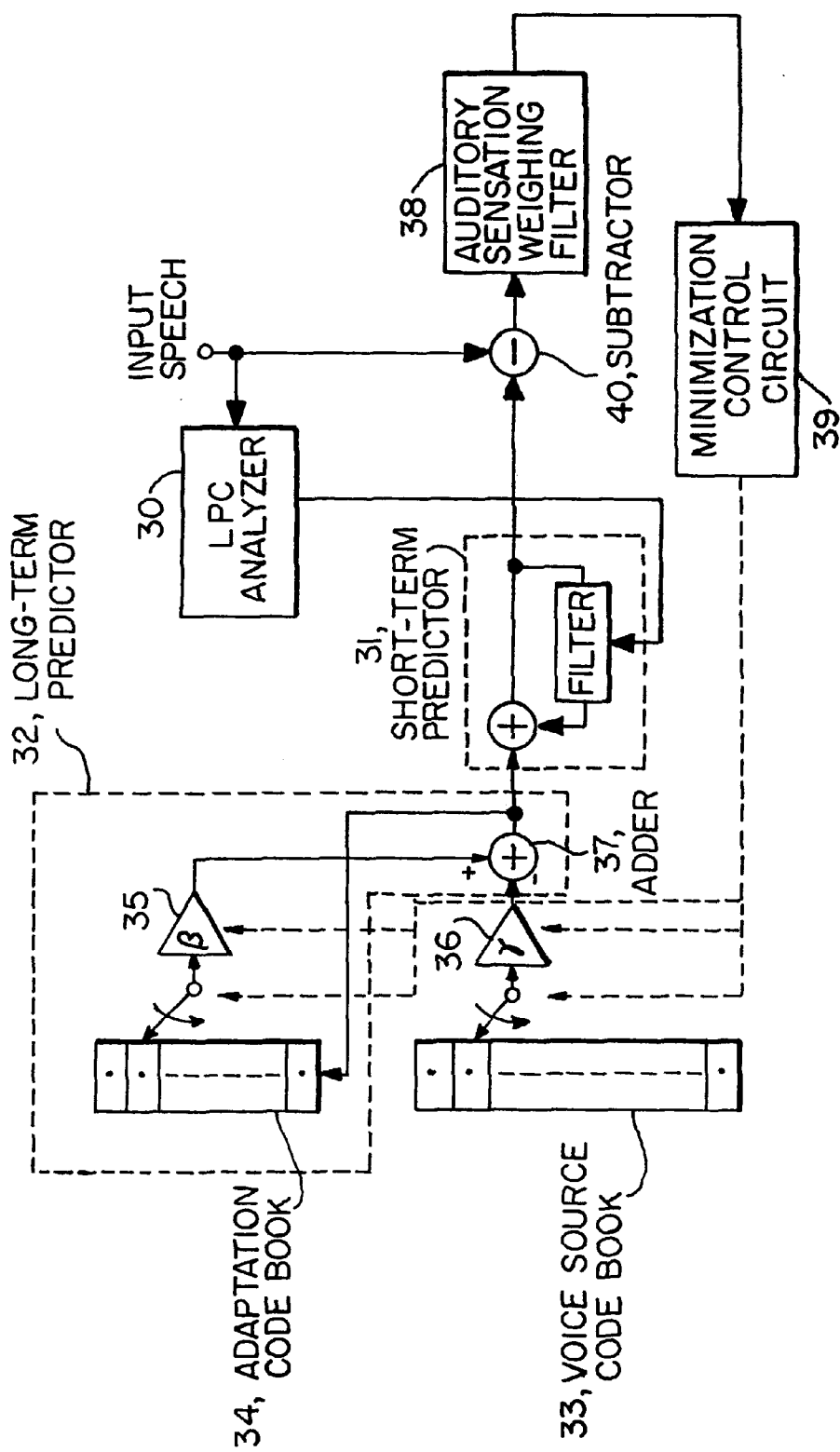
FIG. 2 is a block diagram of a CELP formula using an adaptive code book.

In such a specific encoding system as shown in FIG. 2, the ambient noise at a transmitting side gives an awkward feeling to a person listening to the voice communication of the receiving side.

Figure 3:
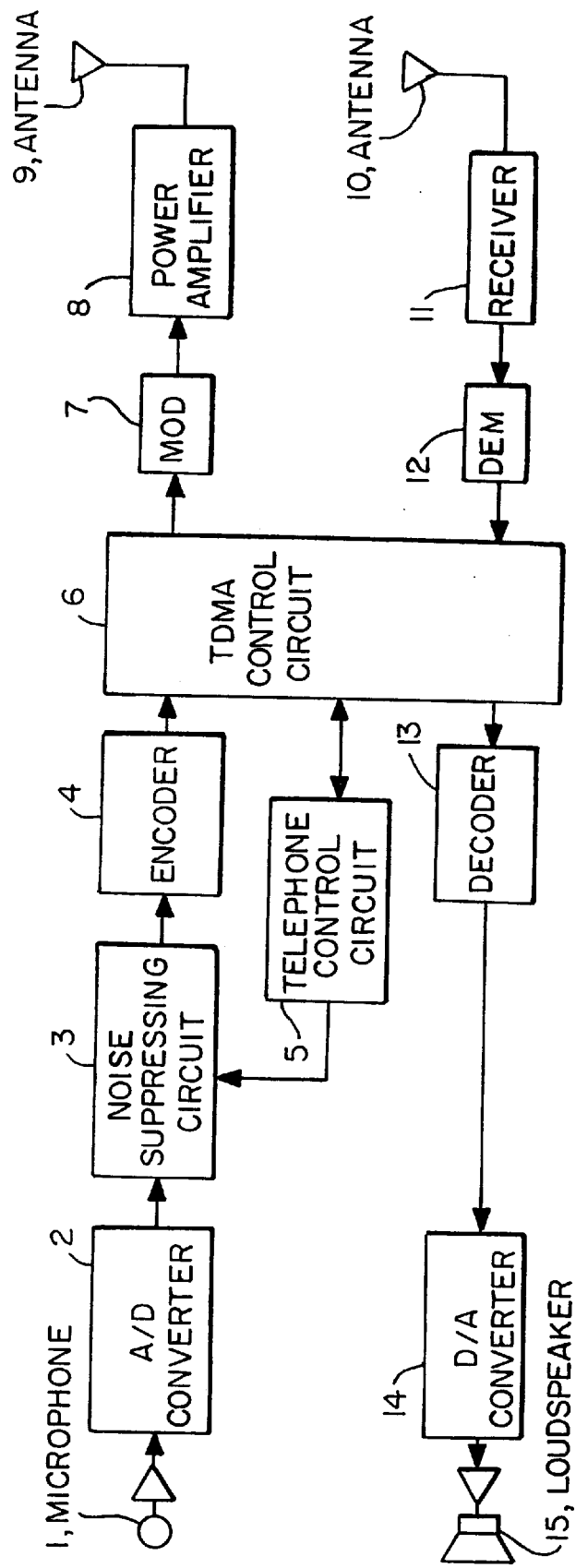
FIG. 3 is a block diagram of a preferred embodiment of the digital portable telephone of the present invention.
Figure 4:
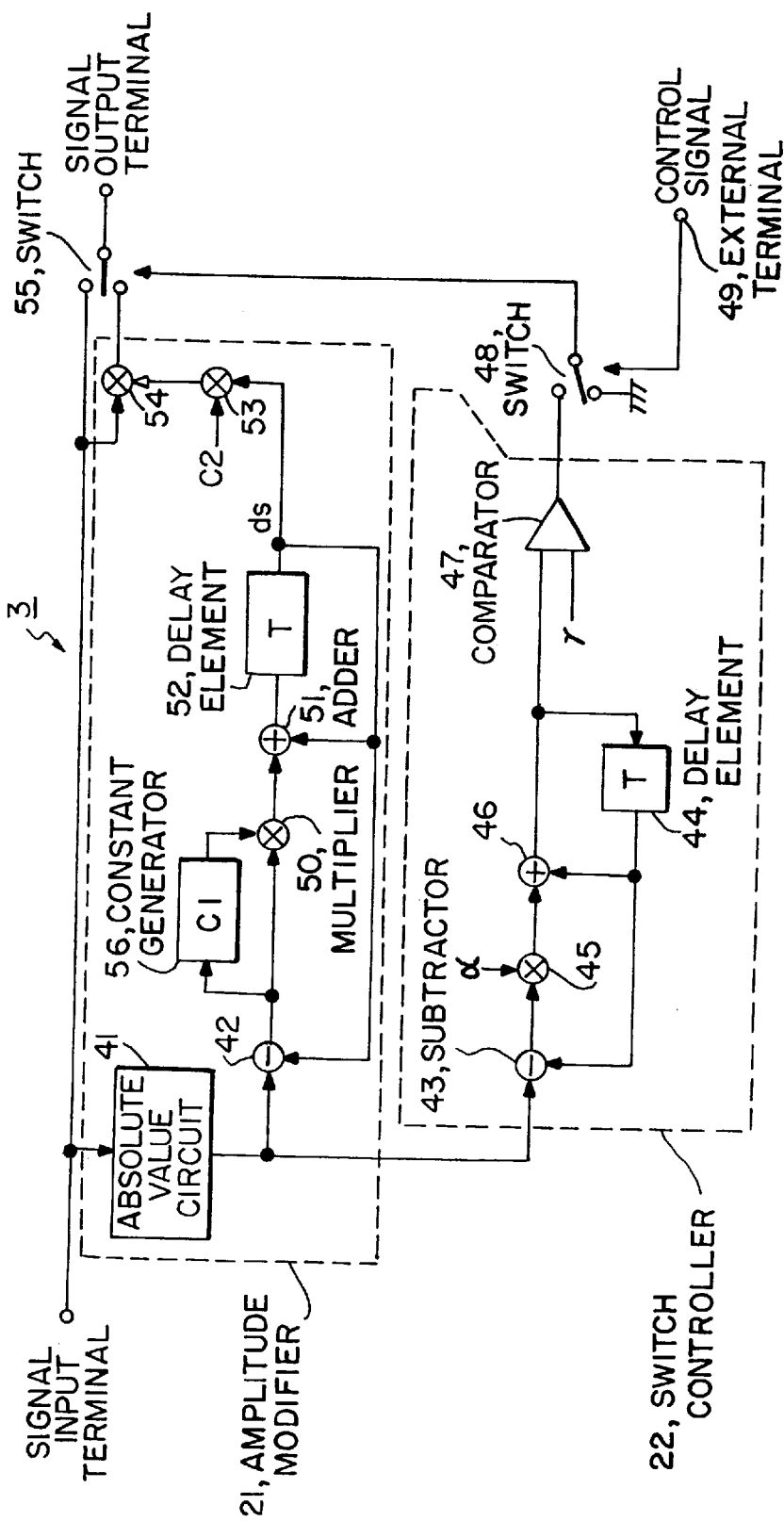
FIG. 4 is a block diagram of a preferred embodiment of the noise suppressing circuit shown in FIG. 3.
Figure 5:
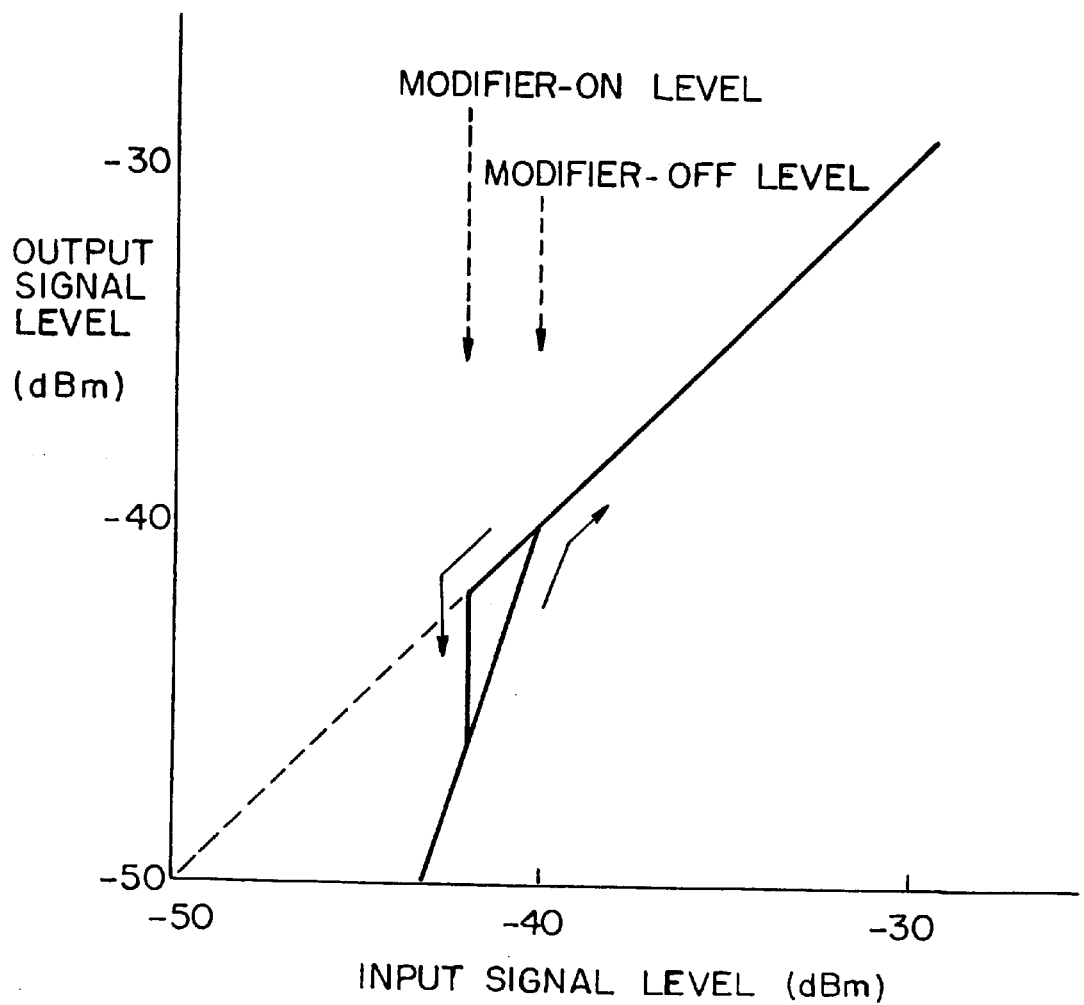
FIG. 5 is a graph showing the input/output ratio of the noise suppressing circuit shown in FIG. 4.

Therefore, the present invention described with reference to a preferred embodiment thereof illustrated in FIGS. 3 to 5, provides a digital portable telephone capable of reducing the ambient noise component of the digital telephone signal.

In FIG. 3, a digital portable telephone according to a preferred embodiment of the present invention consists of a microphone 1, an analog-to-digital (A/D) converter 2, a noise suppressing circuit 3, an encoder 4, a control circuit 6, a telephone control circuit 5, a modulator 7, a power amplifier 8, antennas 9 and 10, a receiver 11, a demodulator 12, a decoder 13, a digital-to-analog (D/A) converter 14 and a loudspeaker 15. Analog signals (speech signals) from the microphone 1 are converted to digital signals with the A/D converter 2. The noise suppressing circuit 3 inputs the digital signals and outputs noise suppressed signals to the encoder 4. The encoder 4 produces encoded signals. The control circuit 6 mixes the encoded signals and a control information from the telephone control circuit 5 and outputs mixed signals to the modulator 7. The modulator 7 produces quadrature phase shift keying (QPSK) modulated signals by a π/4 shift QPSK formula. The QPSK modulated signals are amplified with the power amplifier 8 and transmitted from the antenna 9 to a base station (not shown).

Also, the receiver 11 receives a radio signals from the base station through the antenna 10 and outputs received signals. The demodulator 12 demodulates received QPSK signals. The control circuit 6 separates the control information from the encoded signals and outputs the control information signals to the telephone control circuit 5 and the encoded signals to the to decoder 13. The decoder 13 decodes the encoded signals into speech signals. The speech signals are converted by the D/A converter 14 into analog signals and outputted to the loudspeaker 15.

FIG. 4 shows a preferred embodiment of the noise suppressing circuit 3 shown in FIG. 3. The noise suppressing circuit 3 selectively keeps the level of the input signal low by multiplying the input signal by a value in order to suppress the noise component when the level of the input signal is less than a predetermined threshold. Preferably, the predetermined threshold is a value corresponding to that which occurs when a person is not speaking.

This noise suppressing circuit 3 is basically an amplitude modifier. Preferably modification will be of a factor of 2. The noise suppressing circuit 3 comprises a modifier 21, a switching controller 22 and switches 48 and 55. The modifier 21 generates a signal which multiplies the input signal by a valuable and the switching controller 22 controls the switch 55 in order to select the input signal or the output of the modifier 21 according to the level of the input signal. The modifier 21 consists of the absolute value circuit 41, subtractor 42, multipliers 50, 53 and 54, adder 51, constant generator 56; and delay element 52. The control portion 22 consists of a subtractor 43, a delay element 44, a multiplier 45, an adder 46, and a comparator 47.

First, there will be described the modifier 21. The absolute value circuit 41 produces the absolute value of an input signal from the signal input terminal. The absolute value is supplied to the subtractor 42. The subtractor 42 subtracts a delayed signal ds of the delay element 52 from the absolute value and outputs a subtracted signal. The delayed signal is an average amplitude of the input signal and the subtracted signal is a difference between the level of the input signal and the average amplitude. The subtracted signal is multiplied by a constant C1 of the constant generator 56 with the multiplier 50. The constant C1 is switched according to the sign of the subtracted signal. The multiplied signal from the multiplier 50 is a repairing value of the average amplitude. The adder 51 adds the delayed signal ds and the multiplied signal from the multiplier 50 and supplies an added signal to the delay element 52. The added signal is a repaired average amplitude and is delayed by an equivalent of one sample with the delay element 52 and becomes the delayed signal ds of the next sample. The multiplier 53 multiplies the delayed signal ds by a constant C2 and supplies a multiplied signal to the multiplier 54. The constant C2 is a value to perform adjustment so that the level at which the modifier operation changes from on to off is at the same point as the 1:1 input/output ratio in the case that the expander is not allowed to operate. The multiplier 54 multiplies the input signal by the multiplied signal of the multiplier 53 and supplies a multiplied signal to the switch 55. The signal whose level becomes low, e.g., the signal which the noise component suppressed, is thus obtained.

By the way, a modifier may be an attenuator. Preferably, in this invention, however, the modifier 21 is used to change the value of an attenuation in response to the level of the signal. The modifier 21 predicts the level of the signal by obtaining the average amplitude and controls the value of the attenuation in response to the average amplitude.

Next, there will be described the switching controller 22. The switching controller 22 predicts the level of the input signal and controls the switch 55 according to the relation between the predicted level of the input signal and the threshold level. The subtractor 43 subtracts a delayed signal of the delay element 44 from the absolute value of the absolute value circuit 41 and outputs a subtracted signal. The subtracted signal is multiplied by a constant a with the multiplier 45. The adder 46 adds the delayed signal and a multiplied signal from the multiplier 45 in order to generate a predicting value of the input signal and supplies an added signal to the delay element 44 and comparator 47. The delay element 44 gives one sample delay to the added signal. The comparator 47 compares the added signal with the threshold level γ, and outputs a high level "H" as a switching control signal when the added signal, e.g., the predicting value of the input signal, is lower than the threshold level γ, or outputs a low level "L" as the switching control signal when the added signal is equal to or higher than the threshold level γ. Unstable operation in the neighborhood of the threshold level can be eliminated by causing the comparator 47 to have a hysteresis upon an increase or decrease in signals.

The switch 55 outputs the multiplied-signal from the multiplier 54, when the switching control signal from the switching controller 22 is the high level "H" or outputs the input signal from the signal input terminal as it is when the switching control signal is at the low level "L" so that the input/output ratio be 1:1. Namely, the noise suppressing circuit outputs a noise suppressed signal from the Amplitude modifier 21 when the level of the input signal is lower than the threshold level, and outputs the input signal when the level of the input signal is equal to or higher than the threshold level.

If the modifier is on, when the level of the speech signal is very low and under the threshold level, a person at the receiving side can not hear the voice because the level of the signal is suppressed. Therefore, the noise suppression circuit further comprises a switch 48 and a external terminal 49. The switch 48 selects the output signal of the comparator 47 or a "L" level by a control signal from the external terminal 49 as a switching control signal. Preferably, the control signal is supplied from the telephone control circuit 5.

The transient characteristic of the modifier 21 is set with the constant C1. For instance, by setting the constant C1 at 0.000824 when the subtracted signal from the subtractor 42 takes a negative sign or at 0.62653 when it takes a positive sign, the attack tine and the recovery time of the modifier are made 5 msec and 200 msec, respectively.

FIG. 5 shows the input/output ratio in the case that the off level of the modifier takes −40 dBm as the threshold level γ. When the telephone users are not speaking, for instance for input signals of −40 Dbm or less, the level of ambient noise, which is encoded as upward speech signals, can be transmitted lower by turning the modifier on.

Although the embodiment has been described with respect to a case in which the modification was based on a specific factor, it goes without saying that the present invention is not restricted to this case.

As hitherto described, the present invention makes it possible to keep low the level of ambient noise, which is transmitted as upward speech, and to reduce the awkward feeling, which derives from the difference between the ambient noise generated by a decoder and that of the original sound, by providing a noise suppressing circuit between an A/D converter, which converts analog signals from a microphone into digital signals, and the encoder.

What is claimed is:

1. A radio transceiver comprising:

noise suppressing means for adjusting a level of an input signal through a microphone, for suppressing ambient noise and for supplying an ambient noise suppressed signal;

encoding means for encoding one of said input signal and said ambient noise suppressed signal, to provide an encoded signal;

switching means for switching one of said input signal and said ambient noise suppressed signal to said encoding means; and switching control means for controlling said switching means according to the level of said speech signal;

wherein said noise suppressing means comprises:

absolute value generating means for producing an absolute value of said input signal;

first subtracting means for subtracting first delayed signals from said absolute value and for outputting first subtracted signals;

first multiplexing means for multiplexing said first subtracted signals by a first predetermined constant switched by a sign of said first subtracted signals and for outputting first multiplied signals;

adding means for adding said first multiplied signals and said first delayed signals and outputting first added signals;

first delaying means for delaying said first added signals by an equivalent of one sample and supplying said first delayed signals to said adding means;

second multiplexing means for multiplexing said first delayed signals by a second predetermined constant and outputting second multiplied signals; and third multiplexing means for multiplexing said speech signals by said second multiplied signals and supplying third multiplied signals, to provide said noise suppressed signals.

2. The radio transceiver as claimed in 1, wherein said noise suppressing means further comprises:

amplitude modifying means for generating said noise suppressed signals.

3. The radio transceiver as claimed in claim 1, said switching control means further comprising:

second subtracting means for subtracting second delayed signals from said input signal and for outputting second subtracted signals;

fourth multiplexing means for multiplexing said second subtracted signals by a third predetermined constant and for outputting fourth multiplied;

second adding means for adding said fourth multiplied signals and said second delayed signals and for outputting second added signals;

second delaying means for producing said second delayed signals from said second added signals;

comparing means for comparing said second added signals with a predetermined threshold and for outputting one level signal as a switching control signal when said second added signals are lower than said threshold or for outputting another level signal as said switching control signal when said second added signals is equal to or higher than said threshold; and first switching means for outputting said input signals when said switching control signal is the another level signal or outputting said third multiplied signals as said noise suppressed signal when said switching control signal is the one level signal.

4. The radio transceiver as claimed in claim 3, said noise suppressing means further comprising:

second switching means for switching said compared signals or the another level signals as said switching control signal in response to an external control signal.

5. The radio transceiver as claimed in claim 4, wherein said external control signal is supplied from a telephone control means.

6. The radio transceiver as claimed in claim 1, wherein the signal input/output ratio of said noise suppressing means is 1:1 when an input signal is equal to or greater than a predetermined threshold, and 1:N when said input signal is lower than said predetermined threshold.

7. The radio transceiver as claimed in claim 1, wherein a threshold level which determines the signal input/output ratio of said noise suppressing means has a hysteresis characteristic when signals are increased and decreased.

8. The radio transceiver as claimed in claim 1, further comprising analog-to-digital converting means for converting analog speech signals from a microphone to digital speech signals and for supplying said digital speech signals to said noise suppressing means.

9. The radio transceiver as claimed in claim 8, further comprising:

modulating means for modulating said encoded signals and for outputting modulated signals; and power amplifying means for amplifying and transmitting said modulated signals.

10. The radio transceiver as claimed in claim 1, wherein said switching control means compares the level of said input signal with a predetermined threshold level and controls said switching means to select said ambient noise suppressed signal to said encoding means when the level of said input signal is less than said predetermined threshold level.

11. The radio transceiver as claimed in claim 10, wherein said predetermined threshold level is a value corresponding to that which occurs when a person is not speaking.

12. The radio transceiver as claimed in claim 10, wherein said switching control means controls said switching means to select said ambient noise suppressed signal when said input signal does not include a speech signal from said microphone.

13. A digital portable telephone comprising:

a transmit side including:

analog-to-digital converter for converting analog input signals from a microphone into digital signals;

noise suppressing circuit for adjusting the signal power level of said digital signals, for suppressing ambient noise and for outputting ambient noise suppressed signals;

encoder for producing encoded signals from one of said digital signals and said ambient noise suppressed signals;

switch for switching one of said digital signals and said noise suppressed signals to said encoder;

switch control for controlling said switch according to the level of said digital signals;

modulator means for modulating mixed signals and for outputting modulated signals; and power amplifies for amplifying and transmitting said modulated signals;

a receive side including:

receiver for detecting signals from an antenna;
demodulator for demodulating said signals from said receiver and for outputting demodulated mixed signals;
decoding means for producing decoded signals from encoded signals; and
digital-to-analog converting means for converting said decoded signals to analog signals;
common to said transmit and receive sides;
telephone controller for producing control information and control signals; and
control circuit for mixing said encoded signals from said transmit side and a control information, for outputting mixed signals, and for separating said mixed signals from said demodulated signals according to control signals on said receive side, said noise suppressing circuit comprising:
    an absolute value generator for producing an absolute value of said speech signals;
    first subtractor for subtracting first delayed signals from said absolute value and for outputting first subtracted signals;
    first multiplier for multiplexing said first subtracted signals by a first predetermined constant switched by a sign of said first subtracted signals and for outputting first multiplied signals;
    an adder for adding said first multiplied signals and said first delayed signals and outputting first added signals;
    a first delaying element for delaying said first added signals by an equivalent of one sample and supplying said first delayed signals;
    a second multiplier for multiplexing said first delayed signals by a second predetermined constant and outputting second multiplied signals;
    a third multiplier for multiplexing said speech signals by said second multiplied signals and supplying third multiplied signals, to provide said noise suppressed signals;
    a second subtractor for subtracting second delayed signals from said speech signals and for outputting second subtracted signals;
    a fourth multiplier for multiplexing said second subtracted signals by a third predetermined constant and for outputting fourth multiplied signals;
    a second adder for adding said fourth multiplied signals and said second delayed signals and for outputting second added signals;
    a second delaying element for producing said second delayed signals from said second added signals;
    a comparator for comparing said second added signals with a predetermined threshold and for outputting a high level signal as a switching control signal when said second added signals are lower than said threshold and for outputting a low level signal as said switching control signal when said second added signals is equal to or higher than said threshold;
    a first switch for outputting said speech signals when said switching control signal is low or outputting said third multiplied signals as said noise suppressed signals when said switching control signal is high; and
    a second switch for switching said compared signals or low signals as said switching control signal by an external control signal.

14. The digital portable telephone as claimed in claim 13, wherein the input/output ratio of said noise suppressing circuit can be regulated at 1:1 by said control information or signals.

15. The digital portable telephone as claimed in claim 13, wherein the signal input/output ratio of said noise suppressing circuit is 1:1 when an input signal is equal to or greater than a predetermined threshold, and 1:N when said input signal is lower than said predetermined threshold.

16. The digital portable telephone as claimed in claim 15, wherein said predetermined threshold is controlled by said control information or signals.

17. The digital portable telephone as claimed in claim 13, wherein said second switch is controlled by said telephone controller.

* * * * *

UNITED STATES PATENT AND TRADEMARK OFFICE
CERTIFICATE OF CORRECTION

PATENT NO. : 5,903,853
DATED : May 11, 1999
INVENTOR(S) : Hideo SANO

It is certified that error appears in the above-identified patent and that said Letters Patent is hereby corrected as shown below:

Column 1,    line 14,    delete "!".

Column 4,    line 40,    after "circuit", insert --3--.

Column 4,    line 50,    delete "tine" and insert --time--.

Signed and Sealed this

Twenty-fifth Day of January, 2000

Attest:

Attesting Officer

*Acting Commissioner of Patents and Trademarks*